US010461758B2

(12) United States Patent
Koerner

(10) Patent No.: US 10,461,758 B2
(45) Date of Patent: Oct. 29, 2019

(54) RING OSCILLATOR HAVING A FLAT FREQUENCY CHARACTERISTIC CURVE

(71) Applicant: Infineon Technologies AG, Neubiberg (DE)

(72) Inventor: Heiko Koerner, Soeding (AT)

(73) Assignee: Infineon Technologies AG, Villach (AT)

( * ) Notice: Subject to any disclaimer, the term of this patent is extended or adjusted under 35 U.S.C. 154(b) by 141 days.

(21) Appl. No.: 15/592,033

(22) Filed: May 10, 2017

(65) Prior Publication Data

US 2017/0353190 A1 Dec. 7, 2017

(30) Foreign Application Priority Data

Jun. 6, 2016 (DE) .................. 10 2016 110 383

(51) Int. Cl.
*H03K 3/03* (2006.01)
*H03L 7/099* (2006.01)
(52) U.S. Cl.
CPC ......... *H03L 7/0995* (2013.01); *H03K 3/0315* (2013.01)
(58) Field of Classification Search
CPC ... H03K 3/0315; H03K 3/0322; H03L 7/0995
USPC .......................................... 331/57
See application file for complete search history.

(56) References Cited

U.S. PATENT DOCUMENTS

| 5,239,274 | A | * | 8/1993 | Chi | H03B 5/20 331/108 B |
| 6,204,694 | B1 | * | 3/2001 | Sunter | G06F 1/08 326/93 |
| 6,633,186 | B1 | * | 10/2003 | Bazes | H03L 7/0805 327/158 |
| 7,629,856 | B2 | | 12/2009 | Thaller | |
| 2009/0267698 | A1 | | 10/2009 | Lin | |
| 2016/0126968 | A1 | * | 5/2016 | Lesso | H03M 1/18 341/155 |

FOREIGN PATENT DOCUMENTS

DE 102007047458 A1 5/2008

OTHER PUBLICATIONS

Office Action, in the German language, from counterpart German Application No. 102016110383.7, dated Mar. 1, 2017, 5 pp.

* cited by examiner

*Primary Examiner* — Levi Gannon
(74) *Attorney, Agent, or Firm* — Schumaker & Sieffert, P.A.

(57) ABSTRACT

A ring oscillator (200) comprises a feedback chain (110, 122) having a plurality of inverters (111-113). The ring oscillator (200) also comprises, for at least one of the inverters (111-113) of the chain (110, 122), a further inverter (211). Each of the at least one further inverter (211) is connected in parallel with the corresponding inverter (111-113) of the chain (110, 122) by means of a capacitor (250).

20 Claims, 4 Drawing Sheets

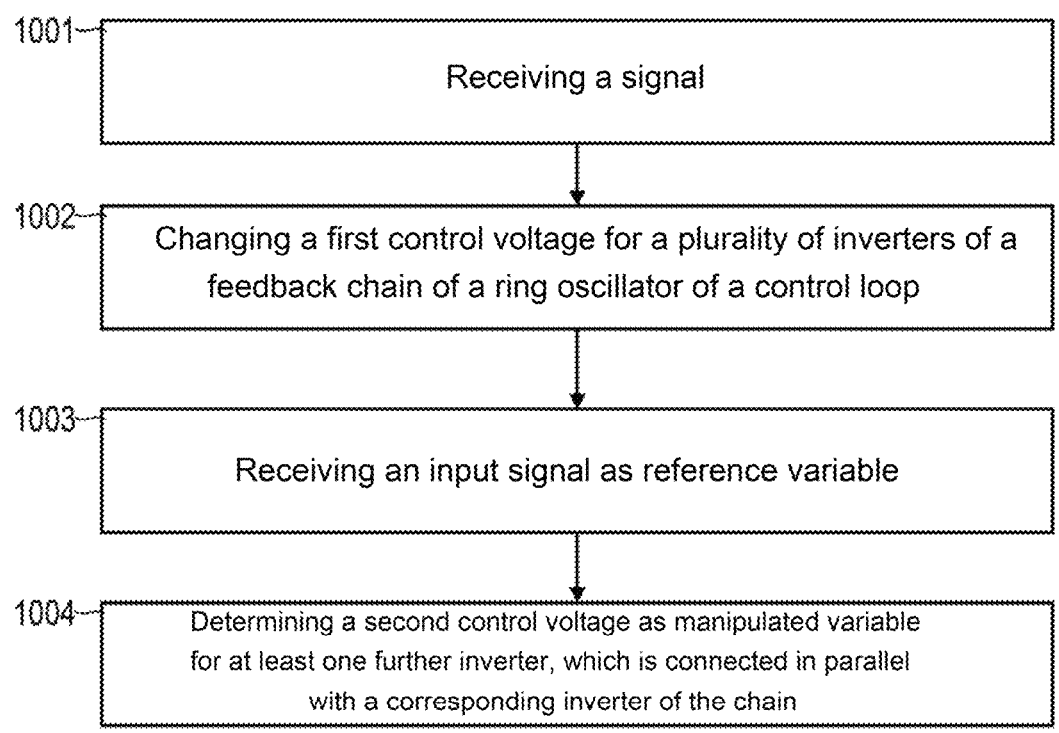

RING OSCILLATOR HAVING A FLAT FREQUENCY CHARACTERISTIC CURVE

TECHNICAL FIELD

Various embodiments of the invention relate to a ring oscillator, which comprises a feedback chain having a plurality of inverters. Further embodiments of the invention relate to a control loop, which comprises a ring oscillator. Further embodiments of the invention relate to a corresponding method.

BACKGROUND

Voltage-controlled oscillators (VCOs) are an essential constituent part of various control loops, for example phase-locked loops (PLLs). VCOs are often implemented by ring oscillators.

Typical functional characteristic variables of control loops comprise stability and dynamic response. Characteristic variables of this kind can be influenced, in particular, by the operating behavior of the VCOs. A significant characteristic variable of the voltage-controlled oscillators in this respect is the frequency characteristic curve. The frequency characteristic curve describes the change in frequency as a function of the control signal. In the case of VCOs, the frequency characteristic curve thus describes the change in frequency f as a function of the control voltage V: $\Delta f/\Delta V$. Said frequency characteristic curve is often also referred to as KVCO. KVCO is typically dependent on the control voltage, KVCO=KVCO(V).

It may be necessary in the case of an excessively large KVCO—for example on average or as a maximum value—for the ring oscillator to be dimensioned to be larger in terms of surface area, in order to achieve a lower frequency. A signal-to-noise ratio can decrease overall because it may be necessary to change the manipulated variable of the control loop in a comparatively small range or to dimension the manipulated variable of the control loop to be very small in absolute terms. As a result, interfering influences become more significant.

FIG. 1A illustrates aspects in relation to a ring oscillator 100 known from the prior art, which implements a VCO having a comparatively steep frequency characteristic curve. The ring oscillator 100 comprises a chain 110 having an uneven number of inverters 111-113. The chain 110 is fed back via a corresponding branch 122. The ring oscillator is of annular design due to the design of the feedback chain 110.

The frequency behavior of the ring oscillator 100 is controlled by means of the control voltage Vtune, which is applied to a corresponding connection 121 and is passed on to all the inverters 111-113. The control voltage Vtune is used here as the supply voltage for the inverters 111-113.

FIG. 1B illustrates the frequency characteristic curve of the ring oscillator 100 from FIG. 1A. The dependency of the frequency on the control voltage Vtune is illustrated here on the left in FIG. 1B. The control voltage is varied here in the range of from 0.5 V to 1.5 V. The frequency varies in this range between approximately 20 MHz and 700 MHz. This corresponds to a large upstroke and therefore to a large KVCO.

The slope of the frequency characteristic curve, that is to say KVCO, is illustrated on the right in FIG. 1B. In particular, KVCO a dependency of KVCO on the control voltage Vtune is illustrated. It is clear from FIG. 1B that KVCO attains comparatively large values in the range of from approximately 300 MHz/V to 700 MHz/V. The maximum of 690 MHz/V corresponds to a frequency of 434 MHz.

Techniques for providing a ring oscillator having a flatter frequency characteristic curve are known from US 2009/0267698 A1. A parallel connection of a first inverter, which is driven by a first supply voltage having a variable value, and a second inverter, which is driven by a second supply voltage having a substantially fixed value, is implemented for this purpose.

A connection of this kind has various disadvantages. For example, in a connection of this kind, it may not be possible, or it may only be possible to a certain extent, to select the value of the supply voltage of the second inverter connected in parallel independently of the value of the supply voltage of the other inverter.

SUMMARY

There is therefore a need for improved VCOs. In particular, there is a need for techniques for providing VCOs having a flatter frequency characteristic curve.

This object is achieved by the features of the independent patent claims. The features of the dependent patent claims define embodiments.

In accordance with one example, a ring oscillator comprises a feedback chain. Said feedback chain comprises a plurality of inverters. The ring oscillator comprises, for at least one of the inverters of the chain, a further inverter, which is connected in parallel with the corresponding inverter of the chain, in particular at the output of the inverter, by means of a capacitor.

In accordance with one example, a method comprises changing a value of a first control voltage for a plurality of inverters of a feedback chain of a ring oscillator of a control loop depending on an operating mode. The method furthermore comprises, in the case of a constant first control voltage and subsequent to the changing of the value of the first control voltage: receiving an input signal as reference variable of the control loop and determining the value of a second control voltage as manipulated variable for at least one further inverter based on the input signal. The at least one further inverter is connected in parallel with a corresponding inverter of the chain.

The features set out above and the features that will be described below can be used not only in the corresponding combinations explicitly set out but also in further combinations or separately, without departing from the scope of protection of the present invention.

BRIEF DESCRIPTION OF THE FIGURES

FIG. 6 is a flow diagram of a method in accordance with various embodiments.

DETAILED DESCRIPTION OF EMBODIMENTS

Figure 1A:
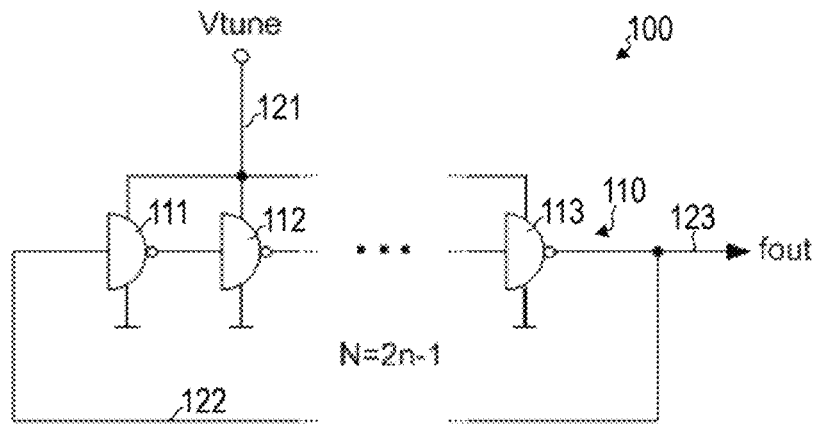
FIG. 1A schematically illustrates a ring oscillator in accordance with reference implementations.

The above-described properties, features and advantages of this invention and the way in which they are achieved will become clearer and more clearly understood in association with the following description of the exemplary embodiments, which are explained in greater detail in association with the drawings.

The present invention is explained in greater detail below on the basis of preferred embodiments with reference to the drawings. In the figures, identical reference symbols indicate identical or similar elements. The figures are schematic representations of various embodiments of the invention. Elements that are illustrated in the figures are not necessarily illustrated true to scale. Rather, the various elements that are illustrated in the figures are reproduced in such a way that their function and general purpose become clear to a person skilled in the art. Connections and couplings illustrated in the figures between functional units and elements can also be implemented as an indirect connection or coupling. A connection or coupling can be implemented using wires or without wires. Functional units can be implemented as hardware, software or a combination of hardware and software.

Techniques in relation to a ring oscillator are described below. In various examples, techniques that can be used for a voltage-controlled ring oscillator are described. In the case of a voltage-controlled ring oscillator, control voltages that supply power to the various inverters are provided. However, the various techniques described herein can also be used for ring oscillators that are not controlled by means of a voltage, but instead are controlled, for example, by means of a flow of current, etc.

In the various examples described herein, a ring oscillator comprises a feedback chain having a plurality of inverters. The output of an inverter of the chain is coupled to the input of a subsequent inverter of the chain. In this case, N denotes the number of inverters in the feedback chain. N is typically an uneven number, for example in the range of 20, 30 or 40. The ring oscillator comprises a branch, which couples the output of the last inverter to the input of the first inverter.

A voltage-controlled ring oscillator of this kind has a dependency of the oscillation frequency at the output of the last inverter (referred to below as frequency for short) on the control voltage, which supplies power to the various inverters of the feedback chain (frequency characteristic curve). Said dependency of the frequency on the value of the control voltage is typically achieved by a dependency of the capacitance of the various transistors that implement the inverters.

Techniques that make it possible to obtain a comparatively flat frequency characteristic curve are described below. This means that, although the frequency exhibits a dependency on the control voltage, said dependency is dimensioned to be lower than in reference implementations. KVCO is small in comparison.

In various examples, for at least one of the inverters of the chain, a further inverter is connected in parallel. Here, the output of the further inverter connected in parallel is coupled to the output of the corresponding inverter of the chain by means of a capacitor. The input of the further inverter connected in parallel is also coupled to the input of the corresponding inverter of the chain.

Figure 2:
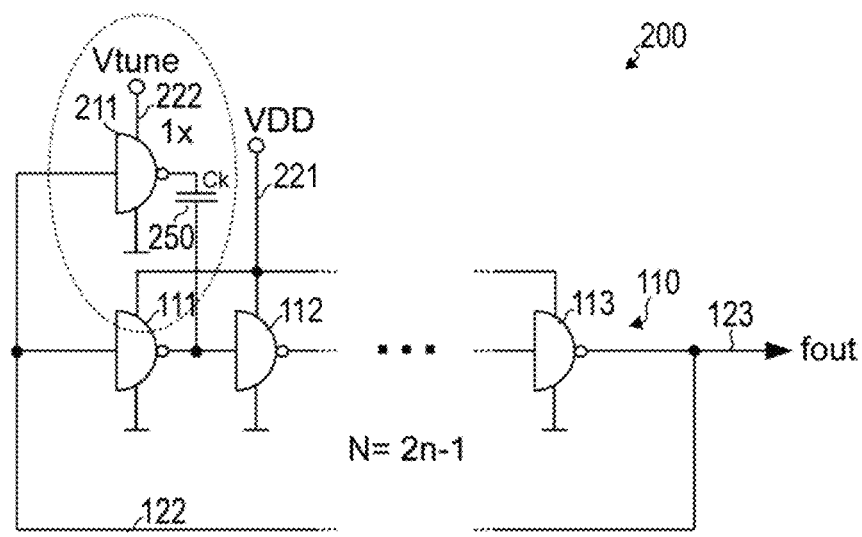
FIG. 2 schematically illustrates a ring oscillator in accordance with various embodiments, which, for at least one of the inverters of a feedback chain, comprises a further inverter, which is connected in parallel with the corresponding inverter of the chain at the output by means of a capacitor.

FIG. 2 illustrates aspects in relation to a ring oscillator 200. The ring oscillator again comprises a feedback chain 110, 122, which comprises a plurality of inverters 111-113. In the example of FIG. 2, only three inverters 111-113 are illustrated; however, generally, the ring oscillator 200 could comprise any number N of inverters 111-113 in the chain 110. For example, N could be in the range from 20-100, preferably at approximately 30-50.

FIG. 2 further illustrates that the inverter 111 has a further inverter 211 connected in parallel (highlighted by the dotted line in FIG. 2). Here, the input of the inverter 111 is coupled to the input of the further inverter 211; the output of the inverter 111 is coupled to the output of the further inverter 211 by means of a capacitor 250.

The capacitor can function as a high-pass filter. Here, the capacitance of the capacitor should be selected in such a way that, for the frequency of the ring oscillator 200 that is reached during operation, there is no attenuation or no significant attenuation by the capacitor 250.

By using the capacitor 250, it is possible for the inverter 111 and the further inverter 211 to be supplied with power using different control voltages VDD and Vtune. The capacitor 250 achieves DC decoupling of the inverter 111-113 of the chain 110 and of the respective further inverter 211 connected in parallel; as a result, it may be possible to make the corresponding control voltages have highly different dimensions. As a result, it is possible to achieve a particularly flexible use of the ring oscillator 200.

In the example of FIG. 2, only the inverter 111 has a further inverter 211 connected in parallel. In general, however, a larger number of inverters 111-113 of the chain 110 could have a corresponding further inverter 211 connected in parallel. For example, it would be possible for a number of M inverters 111-113 of the chain 110 to have in each case a further inverter 211 connected in parallel. Here, the ratio of M to N can be, for example, not greater than 50%, preferably not greater than 20%, particularly preferably not greater than 5%. This means that a comparatively small number of inverters 111-113 of the chain 110 has an associated, further inverter 211 connected in parallel.

For example, it would be possible for the number of M inverters of the chain, which each have a further inverter connected in parallel, to be not greater than ten, preferably not greater than five, particularly preferably not greater than one.

A particularly flat frequency characteristic curve can be implemented by comparatively few further inverters 211 connected in parallel.

It is clear from FIG. 2 that the ring oscillator 200 comprises a first connection 221 and a second connection 222. The first connection 221 is configured to provide a first control voltage VDD to the inverters 111-113 of the chain 110. The first control voltage VDD is not passed on to the further inverters 211. The second connection 222 is configured to provide a second control voltage Vtune to the further inverter 211, said second control voltage generally being able to be different from the first control voltage.

The functioning of the ring oscillator 200 is explained below. If the further inverter 211 is supplied with a comparatively low second control voltage Vtune, the further inverter 211 slows the switching process of the chain 110; a lower frequency of the ring oscillator 200 is achieved as a result. In the case of a comparatively high second control voltage, in contrast, the further inverter 211 accelerates the switching process of the chain 110; a higher frequency of the ring oscillator 200 is achieved as a result. It is apparent from this that the second control voltage Vtune can be used to set different frequencies.

Furthermore, it is possible to achieve a situation in which KVCO(Vtune) is dimensioned to be comparatively low. This can be achieved by virtue of the fact that the switching process is accelerated or slowed for only some of the inverters 111-113 of the chain 110 and typically is not accelerated or slowed for all inverters of the chain. KVCO (Vtune)/KVCO(VDD) can in this case correspond approximately to M/N.

It may therefore be possible to determine an operating point of the ring oscillator 200 in relation to the frequency by means of the first control voltage VDD of the inverters 111-113 of the chain 110; in the event of the ring oscillator 200 being operated as a control section—a control functionality can then be achieved in turn by means of the supply voltage Vtune of the further inverter or inverters 211. This is illustrated in FIG. 3.

Figure 1B:
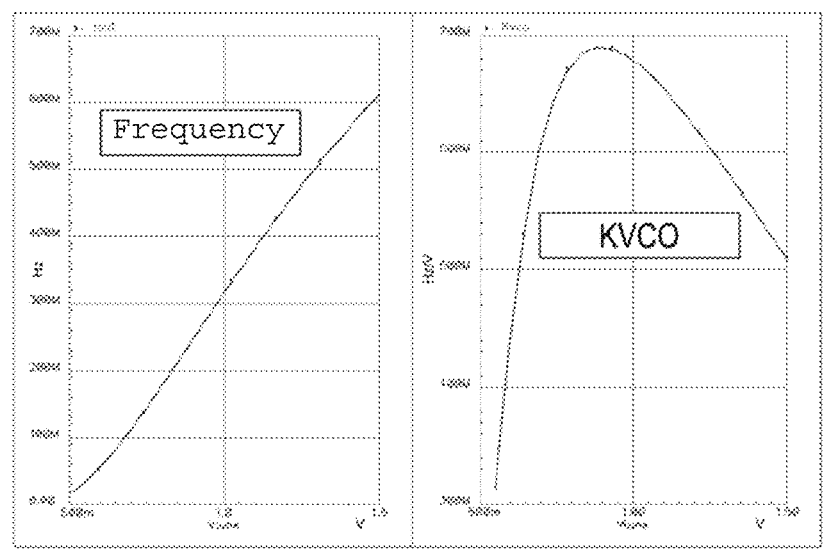
FIG. 1B schematically illustrates a frequency characteristic curve of the ring oscillator of FIG. 1A.
Figure 3:
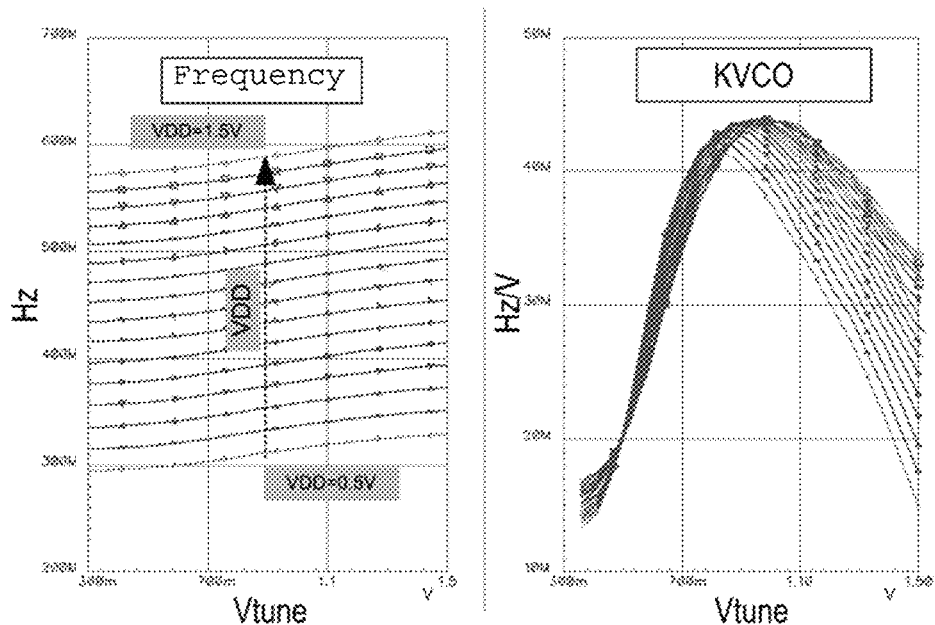
FIG. 3 schematically illustrates the frequency characteristic curve of the ring oscillator of FIG. 2.

FIG. 3 illustrates aspects in relation to the frequency characteristic curve of the ring oscillator 200 from FIG. 2. The left-hand side of FIG. 3 illustrates the dependency of the frequency of the ring oscillator 200 on the second control voltage Vtune. It is clear from FIG. 3 that the frequency of the ring oscillator 200 varies only comparatively slightly as a function of the second control voltage Vtune: KVCO (Vtune), see the right-hand side of FIG. 3, is between approximately 15 MHz/volts and 44 MHz/volts. From a comparison of FIGS. 3 and 1B, it follows, approximately, that: KVCO(Vtune)/KVCO(VDD)=1/16.

The operating point of the ring oscillator 200, that is to say the fundamental frequency around which the frequency can be finely adjusted based on the second control voltage Vtune, is determined by the first control voltage VDD; FIG. 3 illustrates in each case frequency characteristic curves for values of the first control voltage VDD in the range of 0.5 V to 1.5 V.

Figure 4:
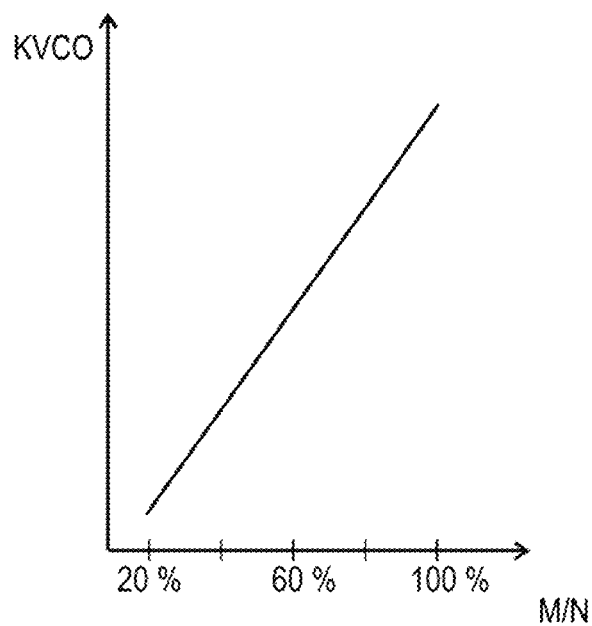
FIG. 4 schematically illustrates the dependency of the slope of the frequency characteristic curve of the ring oscillator of FIG. 2 on the number of further inverters connected in parallel.

FIG. 4 illustrates aspects in relation to the frequency characteristic curve of the ring oscillator 200 from FIG. 2. In particular, FIG. 4 illustrates a dependency of KVCO(Vtune) on the number of further inverters 211 that are connected in parallel with the inverters 111-113 of the chain 110. FIG. 4 illustrates KVCO as a function of M/N. It is clear from FIG. 4 that KVCO becomes greater, the more further inverters 211 connected in parallel there are.

Figure 5:
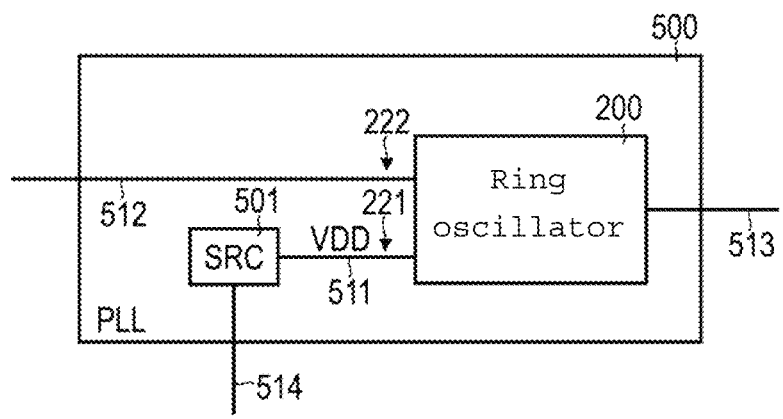
FIG. 5 schematically illustrates a control loop, which comprises a ring oscillator in accordance with various embodiments.

FIG. 5 illustrates aspects in relation to a control loop 500, which comprises a ring oscillator 200 in accordance with various techniques described herein. For example, the control loop 500 can be a PLL control loop. However, other control loops would also be possible.

The control loop 500 comprises the ring oscillator 200. The ring oscillator 200 implements a control section of the control loop 500. This means that a signal at the output 513 of the ring oscillator is set in a controlled manner.

The control loop 500 comprises, in detail, an input connection 512, which is configured to receive an input signal as reference variable. The output signal is set depending on the reference variable. To this end, the value of the second control voltage Vtune is determined here as manipulated variable of the control loop 200 based on the input signal.

When implemented as a PLL control loop 500, the control loop 500 could comprise, for example, a phase comparator (not illustrated in FIG. 5), which receives the input signal and compares it with an actual variable that corresponds to the output of a control section 200. The output of the phase comparator can then be provided as control signal to the ring oscillator 200 by means of an optional filter element (not illustrated in FIG. 5). The input of the control section—here, of the ring oscillator 200—is often referred to as the manipulated variable.

It is clear from this description that the value of the second control voltage Vtune of the at least one further inverter 211 is changed during a control operation. This is the case since the second control voltage Vtune implements the manipulated variable of the control loop 500. At the same time, the first control voltage VDD does not implement the manipulated variable of the control loop 500; the first control voltage VDD is therefore also not determined based on the input signal as reference variable.

In the example of FIG. 5, the control loop 500 instead comprises a voltage source 501. The voltage source 501 is configured to generate the first control voltage VDD and to deliver it to the connection 221. The inverters 111-113 of the chain 110 are supplied with the first control voltage VDD.

Despite the comparatively flat frequency characteristic curve, based on the second control voltage Vtune, it is possible to be able to cover a comparatively large frequency range by means of the voltage source 501. To that end, the inverters 111-113 of the chain 110 of the ring oscillator 200 are supplied with the first control voltage VDD, which can be set by means of the voltage source 501. For example, it would be possible for the signal source 501 to be configured to change the value of the first control voltage depending on an operating mode of the control loop 500. To that end, the voltage source 501 can receive a corresponding signal by means of an input 514, which signal indicates the operating mode. For example, the operating mode can be indicative of an operating point or a fundamental frequency, around which the control functionality is intended to be implemented by the second control voltage Vtune (cf. FIG. 3, left-hand side)

DC decoupling of the at least one further inverter 211 from the inverters 111-113 of the chain 110 can achieve a situation in which the first control voltage VDD and the second control voltage Vtune can assume very different values. In particular, parallel-path currents between the inverters 111-113, 221 connected in parallel are prevented. For example, the signal source 501 could be configured to change the value of the first control voltage VDD in the range of from 0%-200% of the value of the second control voltage Vtune. As a result, a greater control range can be implemented and, at the same time, operating points can be implemented over a large frequency range.

The voltage source 501 can be configured, for example, to keep the value of the first control voltage VDD constant during a control operation of the control loop 500. This ensures that the control functionality of the control loop 500 is not restricted by a variable first control voltage.

FIG. 6 is a flowchart of an exemplary method.

In step 1001, a signal is received. For example, the signal may be indicative of an operating mode of a control loop. The control loop can be, for example, a PLL control loop having a ring oscillator as control section in accordance with various examples described herein.

The operating mode can be defined here, for example, in relation to a fundamental frequency of the ring oscillator: The control can be effected around the fundamental frequency. The operating mode can therefore determine an operating point of the ring oscillator, around which the control operation can adjust the frequency.

In step 1002, a first control voltage is changed. The first control voltage is provided to a plurality of inverters of a feedback chain of the ring oscillator of the control loop.

Here, the first control voltage is determined depending on the operating mode. For example, the first control voltage can be determined in such a way that the ring oscillator has a frequency that corresponds to the operating mode. In order to generate the first control voltage, a digitally controllable voltage source and/or a variable voltage divider etc. can be provided, for example.

In step 1003, an input signal is received as reference variable of the control loop. In step 1004, a second control voltage is determined as manipulated variable of the control loop based on the input signal. A comparator, for example, can be provided for this purpose, said comparator comparing an output of the ring oscillator with the reference variable. The second control voltage is then provided in turn to the ring oscillator. In particular, at least one further inverter of the ring oscillator is supplied with power by means of the second control voltage.

Each of the at least one further inverter is connected in parallel with an inverter of the chain of the ring oscillator, for example by means of a capacitor. The capacitor can effect DC decoupling such that the first control voltage and the second control voltage can have very different values. As a result, the control loop can be operated in a very flexible manner and with a large dynamic range.

The control operation is implemented by the second control voltage. For example, the frequency of the ring oscillator can be changed until a phase shift between the frequency of the ring oscillator and the input signal disappears.

In conclusion, techniques for obtaining a comparatively flat frequency characteristic curve for a ring oscillator have been described above. In this case, a further inverter is connected in parallel with an inverter of the chain of the ring oscillator. The frequency of the ring oscillator is then adjusted by means of changing the supply voltage to the further inverter connected in parallel—and not by means of adjusting the supply voltage to the inverter of the chain. The fundamental frequency, however, can be set by means of changing the supply voltage to the inverter of the chain.

The various techniques described herein can, for example, be used in transmitters that have an antenna for the purpose of wireless transmission. For example, such transmitters could be used in radio-controlled keys for a vehicle. However, other areas of application would also be conceivable.

It goes without saying that the features of the above-described embodiments and aspects of the invention can be combined with one another. In particular, the features can be used not only in the described combinations, but also in other combinations or by themselves, without departing from the field of the invention.

The invention claimed is:

1. A ring oscillator comprising:
a feedback chain including a plurality of inverters, and
for at least one of the inverters of the feedback chain: a further inverter, which is connected in parallel with a corresponding inverter of the feedback chain by a capacitor and which comprises an input that is directly coupled with an input of the corresponding inverter of the feedback chain.

2. The ring oscillator according to claim 1,
wherein the feedback chain has a number of N inverters,
wherein a number of M inverters of the feedback chain has in each case a further inverter connected in parallel,
wherein a ratio of M to N is not greater than 50%.

3. The ring oscillator according to claim 2, wherein the ratio of M to N is not greater than 5%.

4. The ring oscillator according to claim 1, wherein the number of M inverters of the feedback chain is not greater than 10.

5. The ring oscillator according to claim 4, wherein the number of M inverters of the feedback chain is not greater than 5.

6. The ring oscillator according to claim 5, wherein the number of M inverters of the feedback chain is not greater than 1.

7. The ring oscillator according to claim 1, further comprising:
a first connection, which is configured to provide a first control signal to the inverters of the feedback chain; and
a second connection, which is configured to provide a second control signal to the at least one further inverter.

8. The ring oscillator according to claim 1, wherein the capacitor is connected between an output of the further inverter and an output of the corresponding inverter of the feedback chain.

9. A control loop comprising:
an input connection, which is configured to receive an input signal as reference variable; and
a ring oscillator comprising: a feedback chain including a plurality of inverters, and for at least one of the inverters of the feedback chain: a further inverter, which is connected in parallel with the corresponding inverter of the feedback chain by a capacitor; and
a signal source, which is configured to generate a first control signal,
wherein the signal source is configured to change a value of the first control signal depending on an operating mode of the control loop,
wherein a value of a second control signal is determined as manipulated variable of a control section based on the input signal, and
wherein the signal source is configured to change the value of the first control signal in a range of from 0%-200% of the value of the second control signal.

10. The control loop according to claim 9, wherein a value of the first control signal is not determined as manipulated variable of the control loop based on the input signal.

11. The control loop according to claim 9, wherein the signal source is configured to keep the value of the first control signal constant during a control operation of the control loop.

12. The control loop according to claim 9,
wherein the feedback chain has a number of N inverters,
wherein a number of M inverters of the feedback chain has in each case a further inverter connected in parallel, and
wherein a ratio of M to N is not greater than 50%.

13. The control loop according to claim 12, wherein the ratio of M to N is not greater than 5%.

14. The control loop according to claim 9,
wherein a number of M inverters of the feedback chain has in each case a further inverter connected in parallel, and
wherein the number of M inverters of the feedback chain is not greater than 1.

15. A method comprising:
depending on an operating mode: changing a value of a first control voltage for a plurality of inverters of a feedback chain of a ring oscillator of a control loop,
subsequently, in the case of a constant first control voltage: receiving an input signal as reference variable of the control loop and determining a value of a second control voltage as manipulated variable for at least one further inverter, which is connected in parallel with a corresponding inverter of the feedback chain, based on the input signal, wherein the at least one further inverter is connected in parallel with the corresponding inverter of the feedback chain by a capacitor.

16. The method according to claim 15, wherein the value of the first control voltage is changed in the range of from 0%-200% of the value of the second control voltage.

17. The method according to claim 15, wherein the method is executed by a control loop comprising:
 an input connection, which is configured to receive an input signal as reference variable, and
 the ring oscillator comprising: the feedback chain including the plurality of inverters, and for at least one of the inverters of the feedback chain: the at least one further inverter, which is connected in parallel with the corresponding inverter of the feedback chain by the capacitor,
 wherein a value of a second control signal is determined as manipulated variable of a control section based on the input signal.

18. The method according to claim 15,
wherein the feedback chain has a number of N inverters,
wherein a number of M inverters of the feedback chain has in each case a further inverter connected in parallel, and
wherein a ratio of M to N is not greater than 50%.

19. The method according to claim 15,
wherein a number of M inverters of the feedback chain has in each case a further inverter connected in parallel, and
wherein the number of M inverters of the feedback chain is not greater than 1.

20. A ring oscillator comprising:
a feedback chain including a plurality of inverters, wherein the feedback chain has a number of N inverters; and
for at least one of the inverters of the feedback chain: a further inverter, which is connected in parallel with a corresponding inverter of the feedback chain by a capacitor,
wherein a number of M inverters of the feedback chain has in each case a further inverter connected in parallel, and
wherein a ratio of M to N is not greater than 50%.

* * * * *

UNITED STATES PATENT AND TRADEMARK OFFICE
CERTIFICATE OF CORRECTION

PATENT NO. : 10,461,758 B2  
APPLICATION NO. : 15/592033  
DATED : October 29, 2019  
INVENTOR(S) : Heiko Koerner Page 1 of 1

It is certified that error appears in the above-identified patent and that said Letters Patent is hereby corrected as shown below:

On the Title Page

Item [73], "Infineon Technologies AG, Villach (AT)" should read --Infineon Technologies AG, Neubiberg (DE)--

Signed and Sealed this  
Thirty-first Day of August, 2021

Drew Hirshfeld  
*Performing the Functions and Duties of the*  
*Under Secretary of Commerce for Intellectual Property and*  
*Director of the United States Patent and Trademark Office*